(12) United States Patent
Chen et al.

(10) Patent No.: US 7,947,599 B2
(45) Date of Patent: May 24, 2011

(54) LASER ANNEALING FOR 3-D CHIP INTEGRATION

(75) Inventors: Howard H. Chen, Yorktown Heights, NY (US); Louis C. Hsu, Fishkill, NY (US); Lawrence S. Mok, Brewster, NY (US); J. Campbell Scott, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 12/018,756

(22) Filed: Jan. 23, 2008

(65) Prior Publication Data

US 2009/0184264 A1 Jul. 23, 2009

(51) Int. Cl.
H01L 21/44 (2006.01)

(52) U.S. Cl. .................. 438/662; 257/E21.348
(58) Field of Classification Search .................. 428/662; 257/E21.348
See application file for complete search history.

(56) References Cited

U.S. PATENT DOCUMENTS

| | | | |
|---|---|---|---|
| 4,318,752 A | 3/1982 | Tien | |
| 6,670,570 B2 | 12/2003 | Giacobbe et al. | |
| 6,852,162 B2 | 2/2005 | Jung | |
| 6,961,078 B2 | 11/2005 | Yamate et al. | |
| 7,015,422 B2 | 3/2006 | Timans | |
| 7,176,407 B2 | 2/2007 | Hunter et al. | |
| 2003/0226834 A1 | 12/2003 | Ishikawa et al. | |
| 2004/0115931 A1 | 6/2004 | Liu et al. | |
| 2006/0086702 A1 | 4/2006 | Smart | |
| 2006/0128073 A1 | 6/2006 | Sun et al. | |
| 2006/0237397 A1 | 10/2006 | Yamazaki et al. | |
| 2007/0187670 A1* | 8/2007 | Hsu et al. | 257/24 |
| 2007/0218657 A1* | 9/2007 | Bet et al. | 438/479 |
| 2008/0210667 A1* | 9/2008 | Yang et al. | 219/121.6 |

* cited by examiner

*Primary Examiner* — Thao P. Le
(74) *Attorney, Agent, or Firm* — Steven M. Greenberg, Esq.; Carey, Rodriguez, Greenberg & Paul

(57) ABSTRACT

A laser annealing method for annealing a stacked semiconductor structure having at least two stacked layers is disclosed. A laser beam is focused on a lower layer of the stacked layers. The laser beam is then scanned to anneal features in the lower layer. The laser beam is then focused on an upper layer of the stacked layers, and the laser beam is scanned to anneal features in the upper layer. The laser has a wavelength of less than one micrometer. The beam size, depth of focus, energy dosage, and scan speed of the laser beam are programmable. Features in the lower layer are offset from features in the upper layer such that these features do not overlap along a plane parallel to a path of the laser beam. Each of the stacked layers includes active devices, such as transistors. Also, the first and second layers may be annealed simultaneously.

9 Claims, 11 Drawing Sheets

US 7,947,599 B2

LASER ANNEALING FOR 3-D CHIP INTEGRATION

BACKGROUND OF THE INVENTION

1. Field of the Invention

The disclosure relates generally to processing of semiconductor devices and, more specifically, to a method of laser annealing sub-surface features in a semiconductor device.

2. Description of the Related Art

To fulfill the ever-increasing demand for computing power, semiconductor chip manufacturers have approached the task of providing more computing power with a single device using various approaches. One of the most commonly used approaches has been to reduce the size of the features in the semiconductor device, which provides the advantages of higher speed, lower power consumption, and a higher density of semiconductor features (e.g., transistors). However, the ability of manufactures to reduce feature size is becoming more expensive and more difficult and beginning to run into fundamental physical limitations.

As a result of these difficulties, many manufacturers are also employing techniques whereby multiple chips (i.e., multiple modules) are being integrated together to operate as a single chip. Initially, these multiple chips were positioned side-by-side with one another. However, in certain applications, particularly with applications where the available footprint is small (e.g., personal digital assistants and mobile phones), there was a need to vertically stack the chips. The vertical stacking of the chips has the advantage of increased transistor density per a given footprint and increased signal communication speed as the distance between the chips is decreased.

The vertical stacking of multiple chips is commonly referred to as 3-D integration. One technique in fabricating 3-D integrated circuits involves separately fabricating 2-D dies then bonding these separate 2-D dies together. The separate 2-D dies are then connected with inter-die vias that extend through the insulation layers surrounding the dies. An issue associated with this technique regards the need to maintain a proper alignment between the separate dies. Also, the distance between the active layers of the separate 2-D dies may still be a substantial distance apart.

Another technique also involves bonding two separate 2-D dies together. However, in this technique, the respectively active layers of the separate 2-D dies are bonded facing one another. In this manner, a reduced distance between the active layers of the separate 2-D dies may be achieved. However, the alignment issue remains. Moreover, non-standard connections (e.g., deep vias) are needed to connect the die to the interconnectors of the semiconductor package. Another issue associated with this technique is that this technique is only directly extendable to two dies, whereas the previously discussed technique may be directly extendable to greater than two dies. There is, therefore, a need for an improved technique for manufacturing a single die having multiple layers of active devices.

BRIEF SUMMARY OF THE INVENTION

Embodiments of the invention provide a novel and non-obvious method for manufacturing a stacked semiconductor device. In particular, a method for laser annealing a stacked semiconductor structure having at least two stacked layers is disclosed. A laser beam is focused on a lower layer of the stacked layers. The laser beam is then scanned to anneal features in the lower layer. The laser beam is also focused on an upper layer of the stacked layers, and the laser beam is scanned to anneal features in the upper layer. The laser has a wavelength of less than one micrometer. The beam size, depth of focus, energy dosage, and scan speed of the laser beam are programmable. Features in the lower layer are offset from features in the upper layer such that these features do not overlap along a plane parallel to a path of the laser beam. Each of the stacked layers includes active devices, such as transistors. Also, the first and second layers may be annealed simultaneously.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
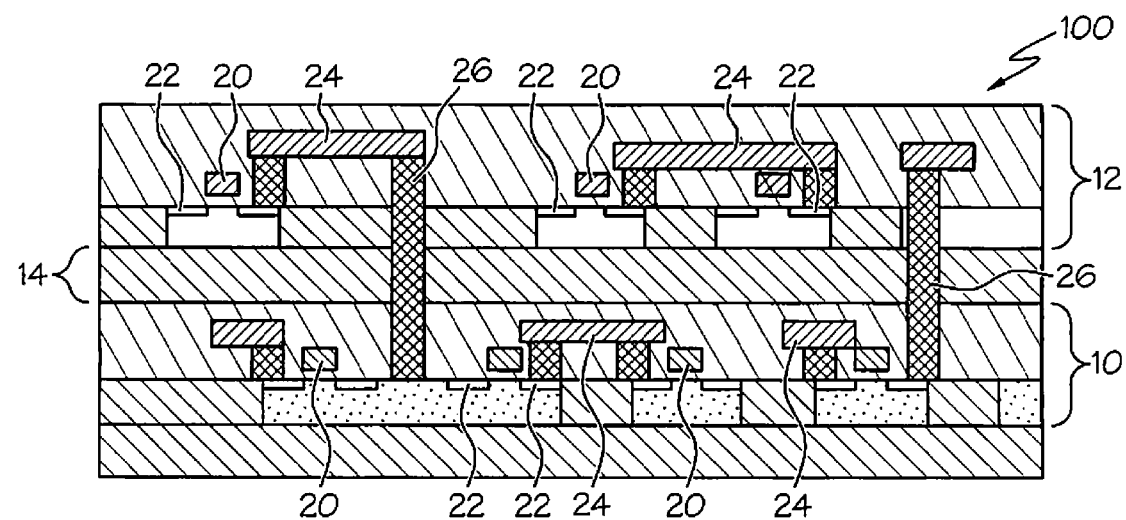
FIG. 1 is a cross-sectional view of a multi-level stacked semiconductor device in accordance with the inventive arrangements.
Figure 2:
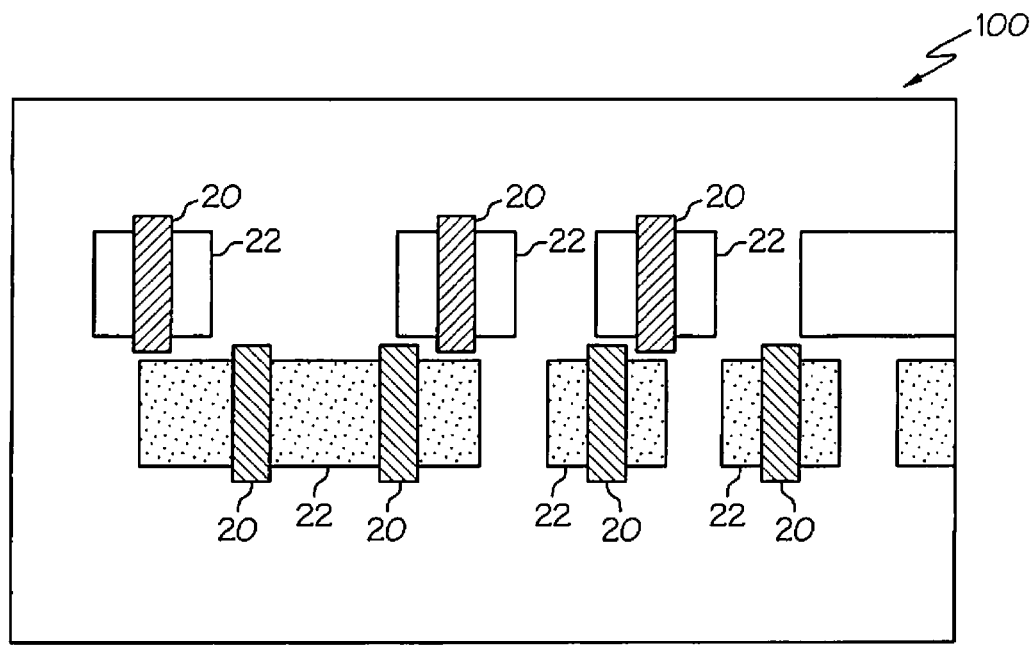
FIG. 2 is a top plan view of the multi-level stacked semiconductor device of FIG. 1.

Referring to FIGS. 1 and 2, a stacked semiconductor structure 100 is illustrated. Although not limited to this specific configuration, the stacked semiconductor structure 100 includes at least two separate stacked layers 10, 12 of active devices (e.g., transistors). Each stacked layer 10, 12 includes a semiconductor material (e.g., silicon, germanium silicon, gallium arsenide) in which semiconductor features such as gates 20, active regions (e.g., source/drain regions 22), and interconnects 24 are formed. Each stacked layer 10, 12 may also include active devices (e.g., transistors) and passive devices (e.g., capacitors, inductors, and resistors) as well as well as other features found in a semiconductor device (e.g., interconnects, doped polysilicon lines, and metal silicide lines). To connect one layer 10 to another layer 12, vias 26 may also be included. An insulation layer 14 (e.g., $SiO_2$) may also be positioned between each stacked layer 10, 12.

Referring to FIG. 2, the devices in the separate layers 10, 12 may be offset from one another to facilitate the separate laser annealing of these separate layers 10, 12. Moreover, the devices in the separate layers 10, 12 may be offset so that these features do not overlap along a plane parallel to a path of the laser beam As compared to prior techniques for providing multiple active layers on a single die, the present stacked semiconductor structure 100 presents several potential advantages. For example, since no bonding necessarily occurs between two separate dies, as with the prior techniques, aligning the separate dies is not an issue. Moreover, a reduced distance can be provided between each stacked layer 10, 12 of active devices than may be provided with the prior techniques. Also, standard connections may be used to the semiconductor package surrounding the stacked semiconductor structure 100. The present technique is also applicable to more than two stacked layers of active devices.

Once active regions 22 of the active device have been doped, there is a need to activate the dopants, and an issue associated with this stacked semiconductor structure 100 is the excessive heating involved in activating the dopants of active regions 22. Typically, active regions 22 are activated using bulk heating or with laser annealing. Regardless of the type of process used to activate the dopants, there is the need to heat those features that require heating while, at the same time, not heating those features (as in known in the art) that are sensitive to excessive heat. Although the present methodology has been discussed with regard to annealing active regions 22 of active devices, the present methodology may also be used to anneal both active devices (e.g., transistors) and passive devices (e.g., resistors, inductors, and capacitors), as well as other features found in a semiconductor device (e.g., interconnects, doped polysilicon lines, and metal silicide lines).

Figure 3A:
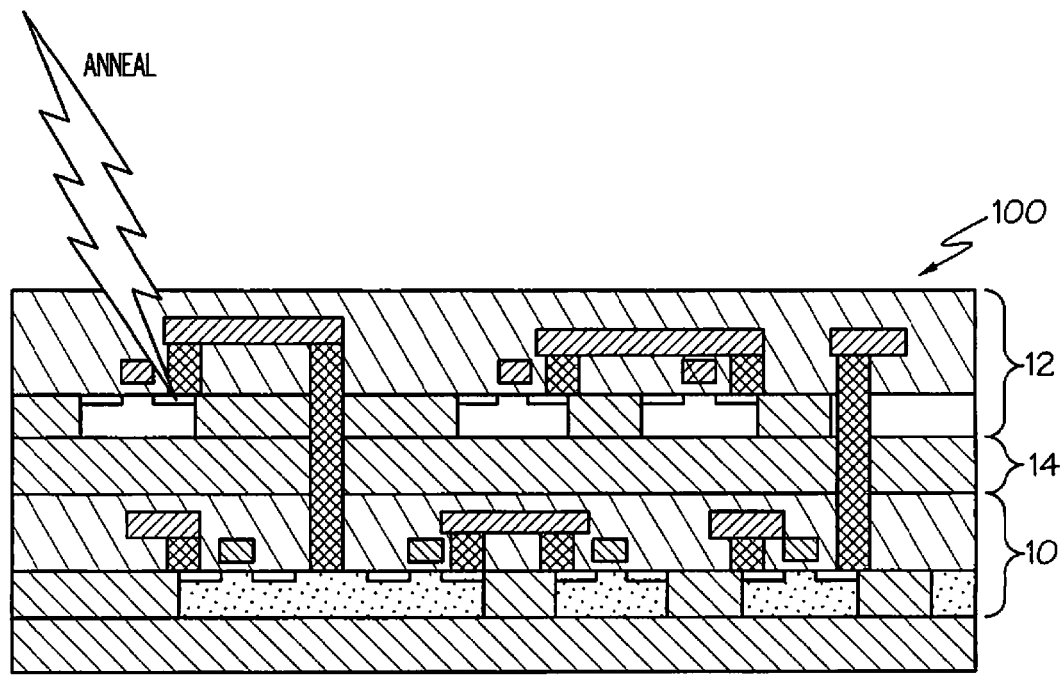
FIGS. 3A and 3B are, respectively, cross-sectional views of the multi-level stacked semiconductor device in which different levels of the semiconductor device are separately annealed, in accordance with the inventive arrangements.
Figure 3B:
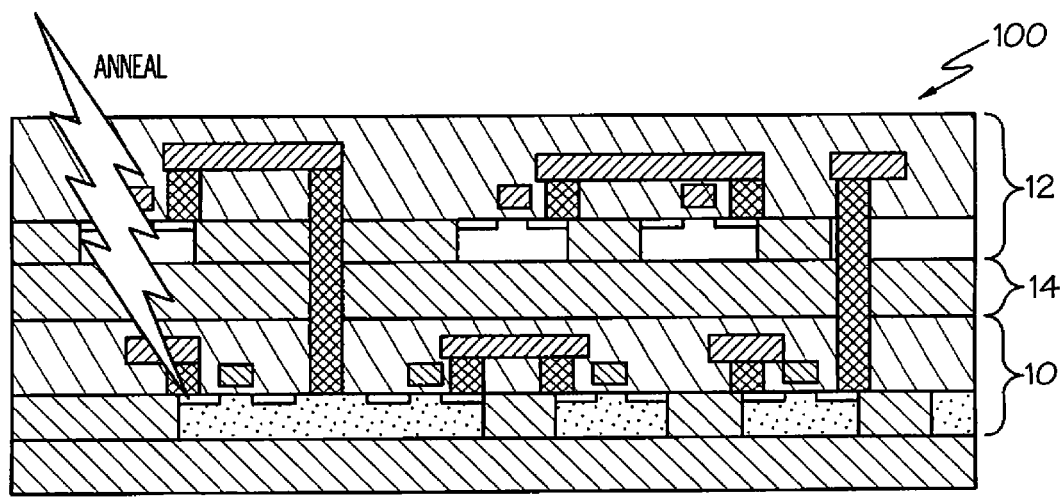
Figure 4:
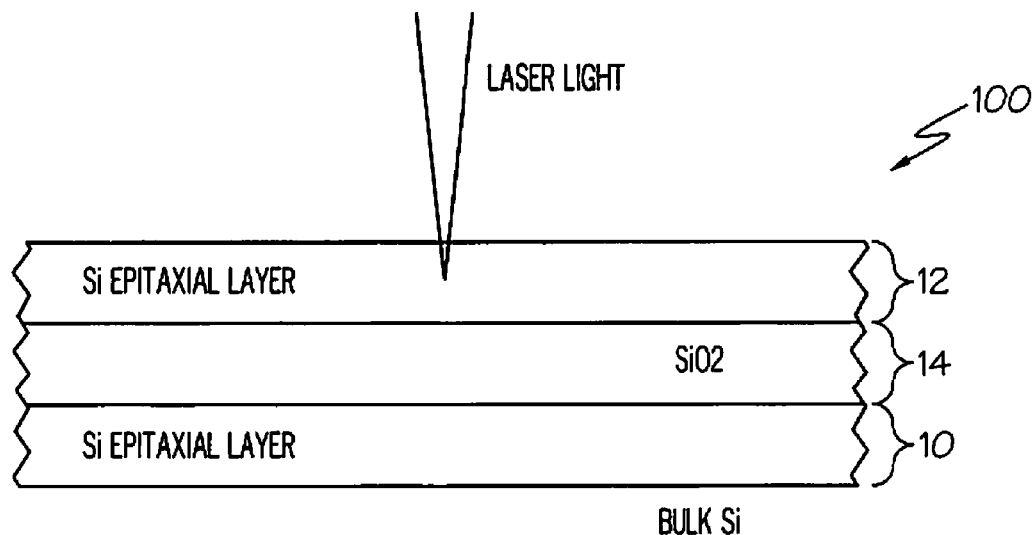
FIG. 4 is a cross-sectional view of a Si/SiO$_2$/Si tri-layer structure.

Referring to FIGS. 3A-3B and FIG. 4, a method of annealing the stacked semiconductor structure 100 is illustrated. Specifically, each of the stacked layers 10, 12 is separately laser annealed to activate the dopants within the active regions 22 of the active device. Although not limited in this manner, the proposed method encompasses methods used to laser anneal a semiconductor substrate with a programmable laser element or multiple elements. The programmable laser elements further comprise methods to precisely control the laser dosage and energy, beam shape and area, and depth of focus.

For 2-D thermal annealing applications, a specific uniform annealing energy can be applied to a designated surface area and location with minimum horizontal proximity effect. For 2-D thermal annealing applications, a specific uniform annealing energy can be applied to a designated depth from a substrate surface with minimum vertical proximity effect.

The programmable laser annealing methods provide significant advantages in 3-D chip integration by combining a plurality of annealing steps, which reduces the annealing cost. For example, both the upper layer 10 and the lower layer 12 may be laser annealed at the same time. Also, the laser beams used to respectively anneal the upper layer 10 and the lower layer 12 may differ in terms of wave length, power, spot size, energy density, depth of focus, and/or scan speed.

As will be further described herein, precise control of focus size and depth also minimizes the possibility of under-annealing or over-annealing. This programmable laser annealing method is capable of annealing semiconductor devices in the lower silicon layers without adverse effect on the semiconductor devices in the upper silicon layers.

Two different types of laser annealing are frequently being employed at the current time. One of these applications employs a 10 micrometer infrared laser. However, this laser heats the bulk Si substrate and may not be suitable to the present 3D laser annealing technique. The second of these applications uses a 850 nanometer laser. However, if this method is used, a carbon overcoat may be needed to facilitate absorption, and annealing of the lower layer may not be possible without heating the top layer to effectively control the depth of annealing. In certain aspects of the present method, the laser has a wavelength of less than one micrometer.

Figure 5:
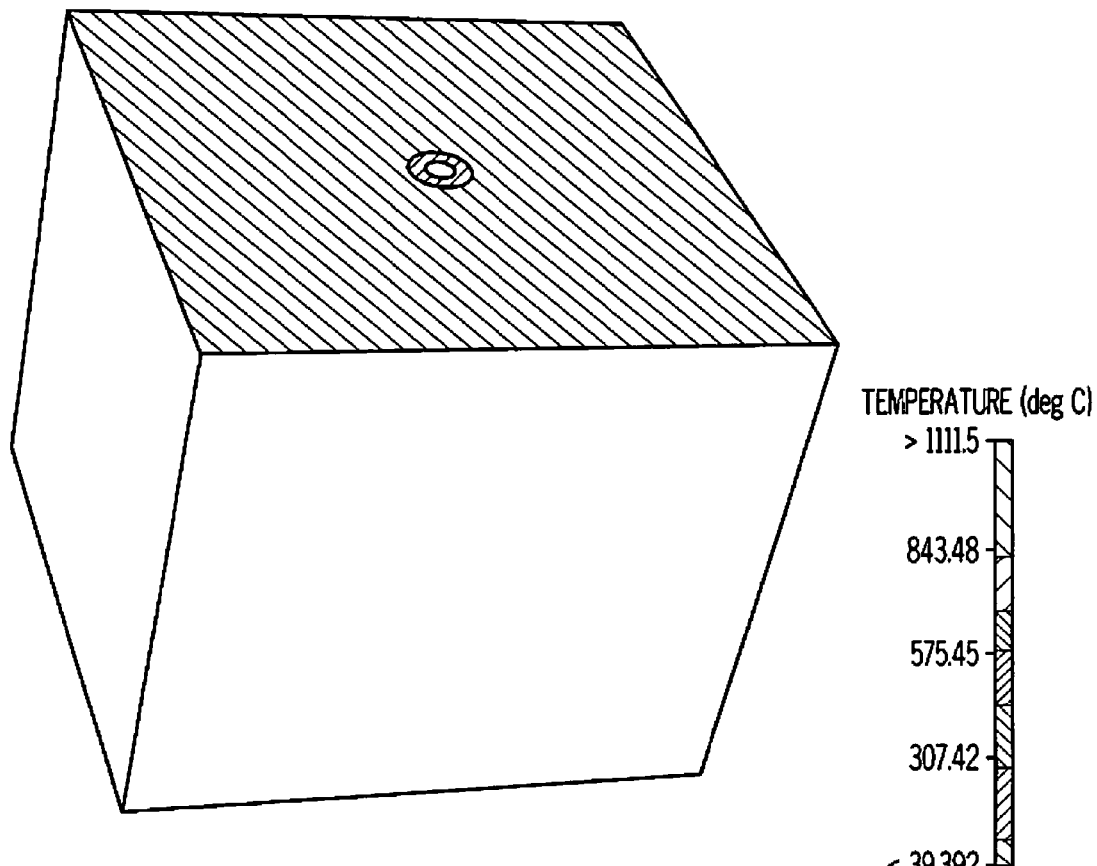
FIG. 5 is a 3-D thermal model of semiconductor and insulation layers on a 1×1×0.875 mm bulk silicon structure.

Referring to FIG. 5, a 3-D thermal model of semiconductor and insulation layers on a 1×1×0.875 mm bulk silicon structure is illustrated. The heat source was provided on the upper Si layer 12 with 0.03 second exposure from a 1 W laser using a 10×10 micron spot size. As shown by the thermal model, the effects of heating by the heat source are localized.

Figure 6:
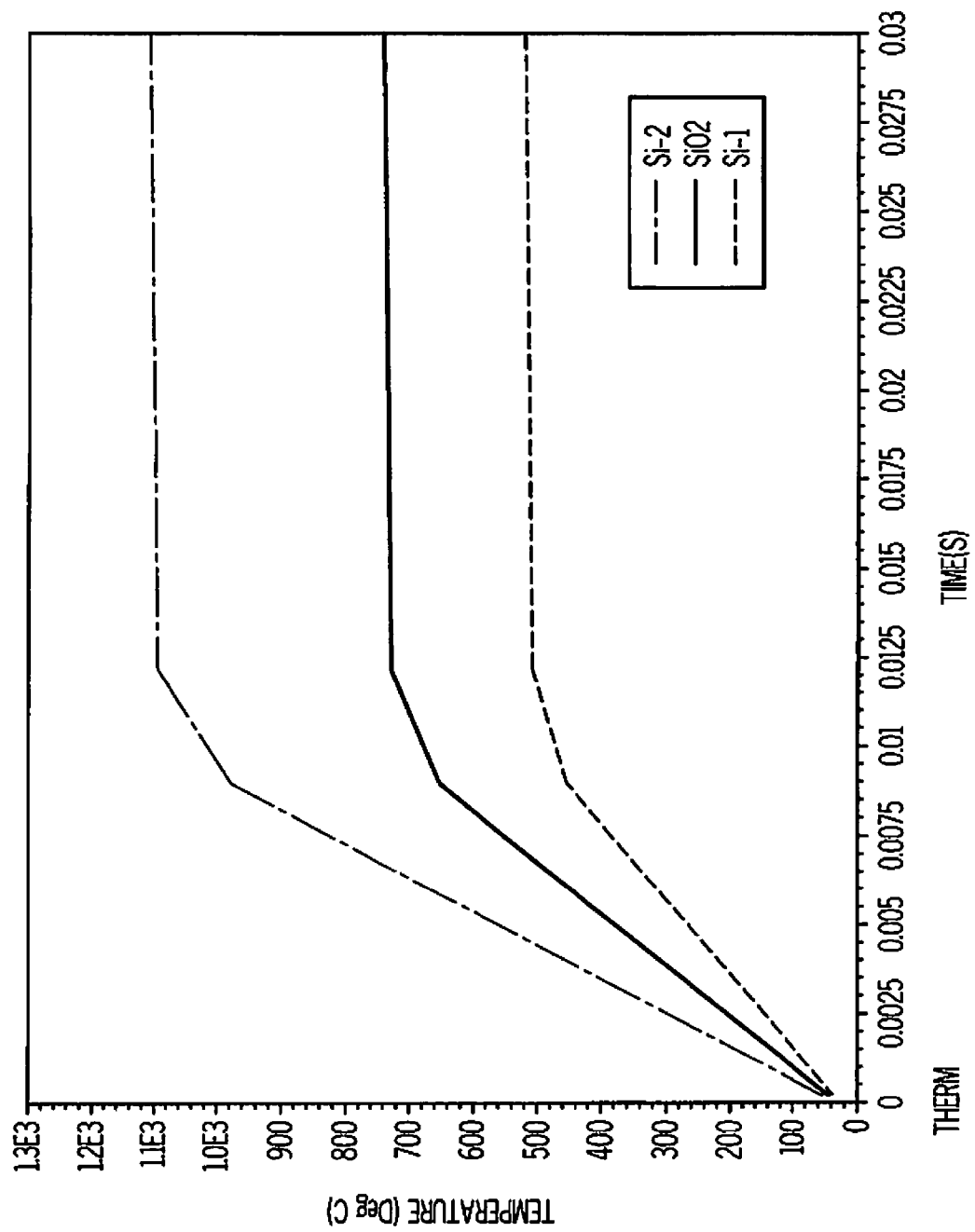
FIG. 6 is a graph showing the temperature profile of the exemplary Si/SiO$_2$/Si tri-layer structure of FIG. 5 after the top Si layer has been exposed to a laser anneal.

Referring to FIG. 6, the temperature profile, over time, of each layer of the exemplary $Si/SiO_2/Si$ tri-layer structure of FIG. 4 is illustrated using the heat source described with regard to FIG. 5 focused on the upper Si layer 12. As illustrated, the temperature in the upper silicon layer 12 can reach a high temperature of 1100° C., whereas the temperature in the lower silicon layer 10 reaches a high temperature of 525° C.

Figure 7:
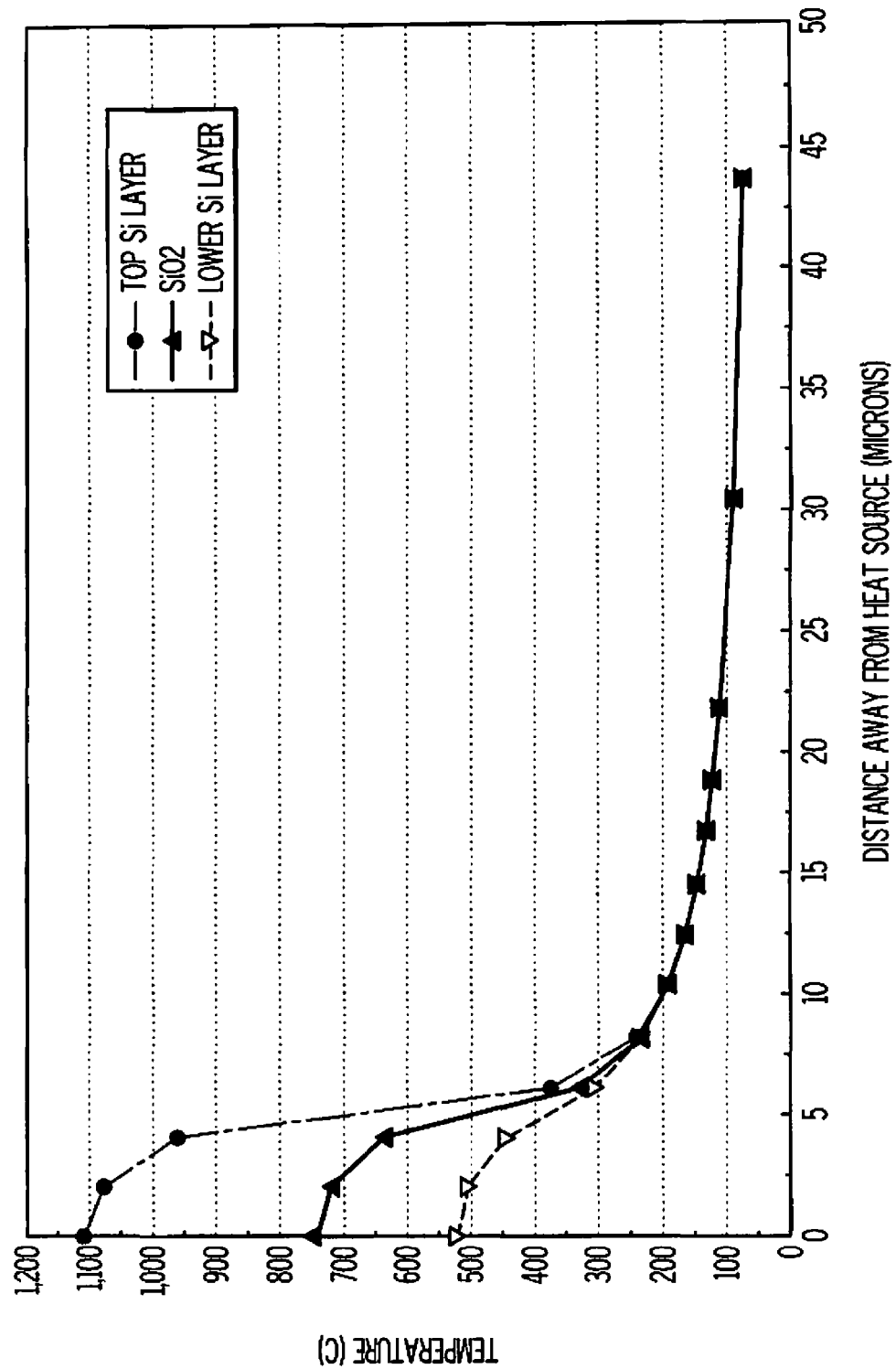
FIG. 7 is a graph showing the horizontal temperature profile of the exemplary Si/SiO$_2$/Si tri-layer structure of FIG. 5 after the top Si layer has been exposed to a laser anneal.

Referring to FIG. 7, the temperature profile, based upon distance from the spot, of each layer of the exemplary $Si/SiO_2/Si$ tri-layer structure of FIG. 4 is illustrated using the heat source described with regard to FIG. 5 focused on the upper Si layer 12. As illustrated, the temperature in the vicinity of the laser spot drops off rapidly at an increasing horizontal distance from the laser beam focus. Thus, the laser annealing process can be precisely controlled and localized at a certain depth.

Figure 8:
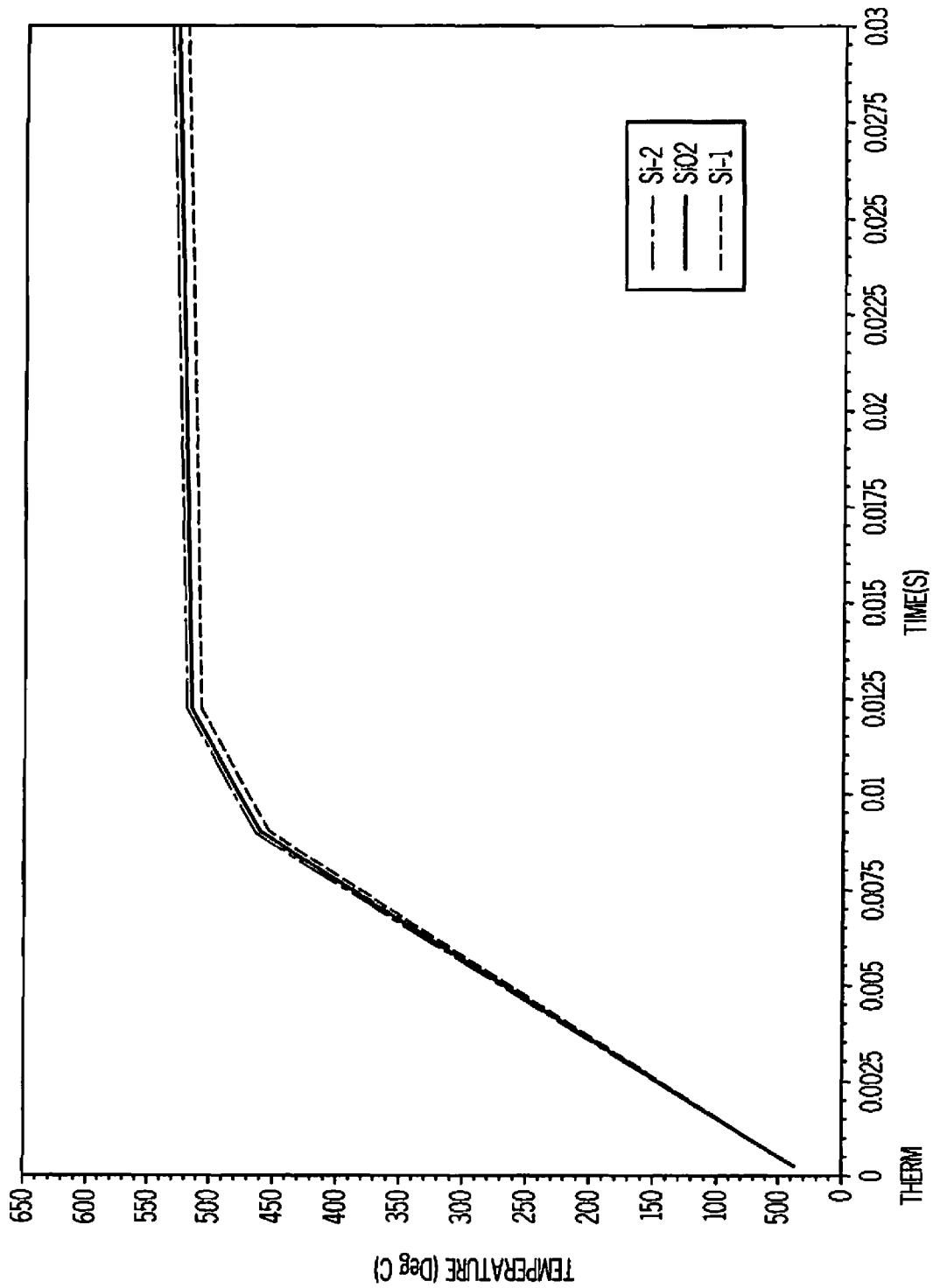
FIG. 8 is a graph showing the temperature profile of the exemplary Si/SiO$_2$/Si tri-layer structure of FIG. 5 after the bottom Si layer has been exposed to a laser anneal.

Referring to FIG. 8, the temperature profile, over time, of each layer of the exemplary $Si/SiO_2/Si$ tri-layer structure of FIG. 4 is illustrated using the heat source described with regard to FIG. 5 (i.e., 0.03 second exposure from a 1 W laser using a 10×10 micron spot size) but focused on the lower Si layer 10. As illustrated, very little temperature difference exists between the upper silicon layer 12 and the lower silicon layer 10 to effectively control the depth of annealing.

Figure 9:
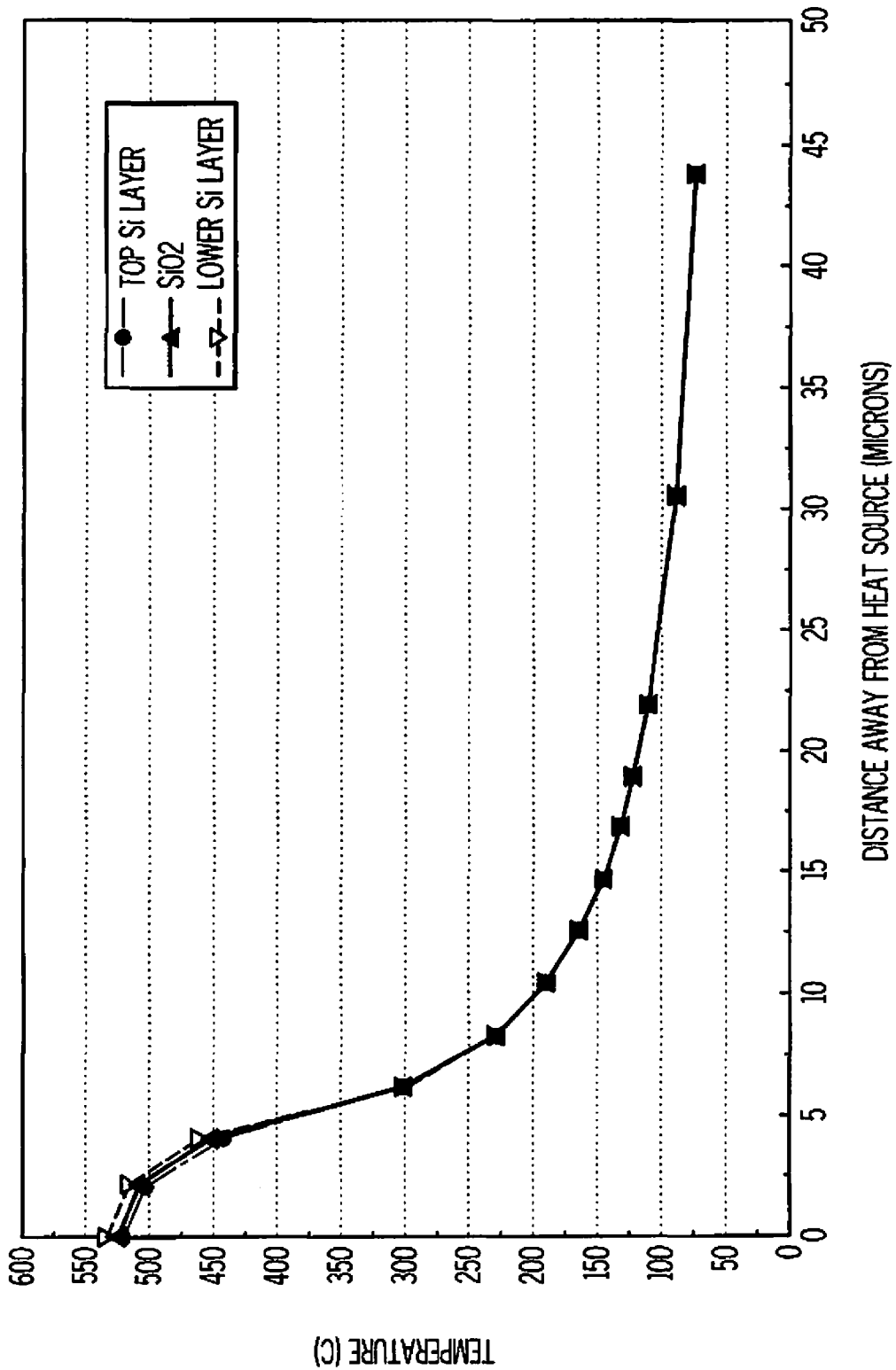
FIG. 9 is a graph showing the horizontal temperature profile of the exemplary Si/SiO$_2$/Si tri-layer structure of FIG. 5 after the bottom Si layer has been exposed to a laser anneal.

Referring to FIG. 9, the temperature profile, based upon distance from the spot, of each layer of the exemplary $Si/SiO_2/Si$ tri-layer structure of FIG. 4 is illustrated using the heat source described with regard to FIG. 5 but focused on the lower Si layer 10. As described with regard to FIG. 8, very little temperature difference exists between the upper silicon layer 12 and the lower silicon layer 10 to effectively control the depth of annealing.

Figure 10:
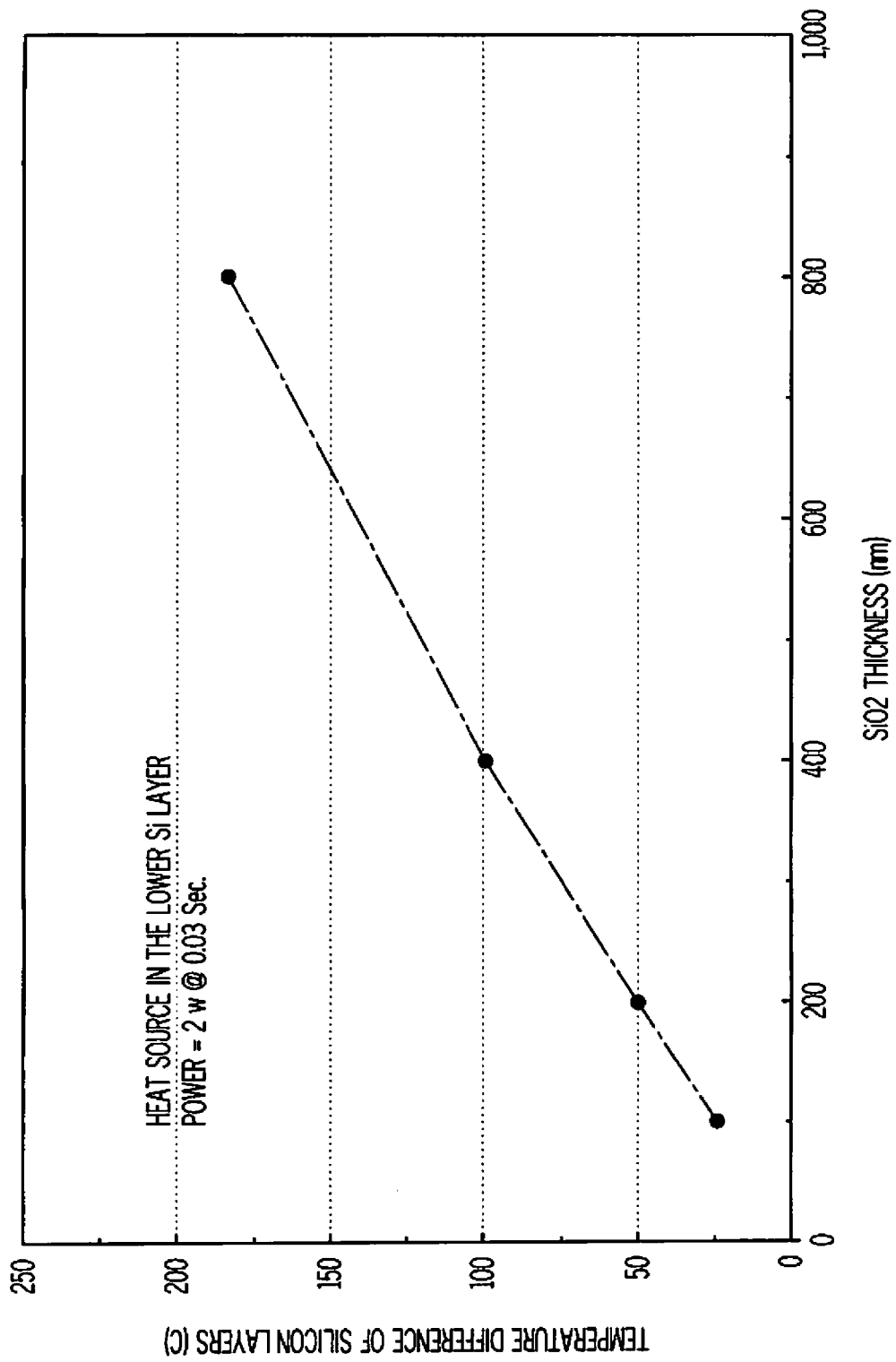
FIG. 10 is a graph showing the effects that the thickness of the SiO2 layer of the exemplary Si/SiO$_2$/Si tri-layer structure of FIG. 5 has on vertical temperature differential between the top and bottom Si layers.

Referring to FIG. 10, the effect of the thickness of the $SiO_2$ insulation layer 14 on the temperature gradient between the top silicon layer 12 and the bottom silicon layer 10 is illustrated. Using a 0.03 second exposure with 2 W laser having a 10×10 micron spot size focused on the lower silicon layer 10, the temperature difference between the top silicon layer 12 and the bottom silicon layer 10 increases substantially linearly with the thickness of the $SiO_2$ insulation layer 14. Therefore, by increasing the thickness of the $SiO_2$ insulation layer 14, the lower silicon layer 10 can be laser annealed without effecting the upper layer 12.

Figure 11:
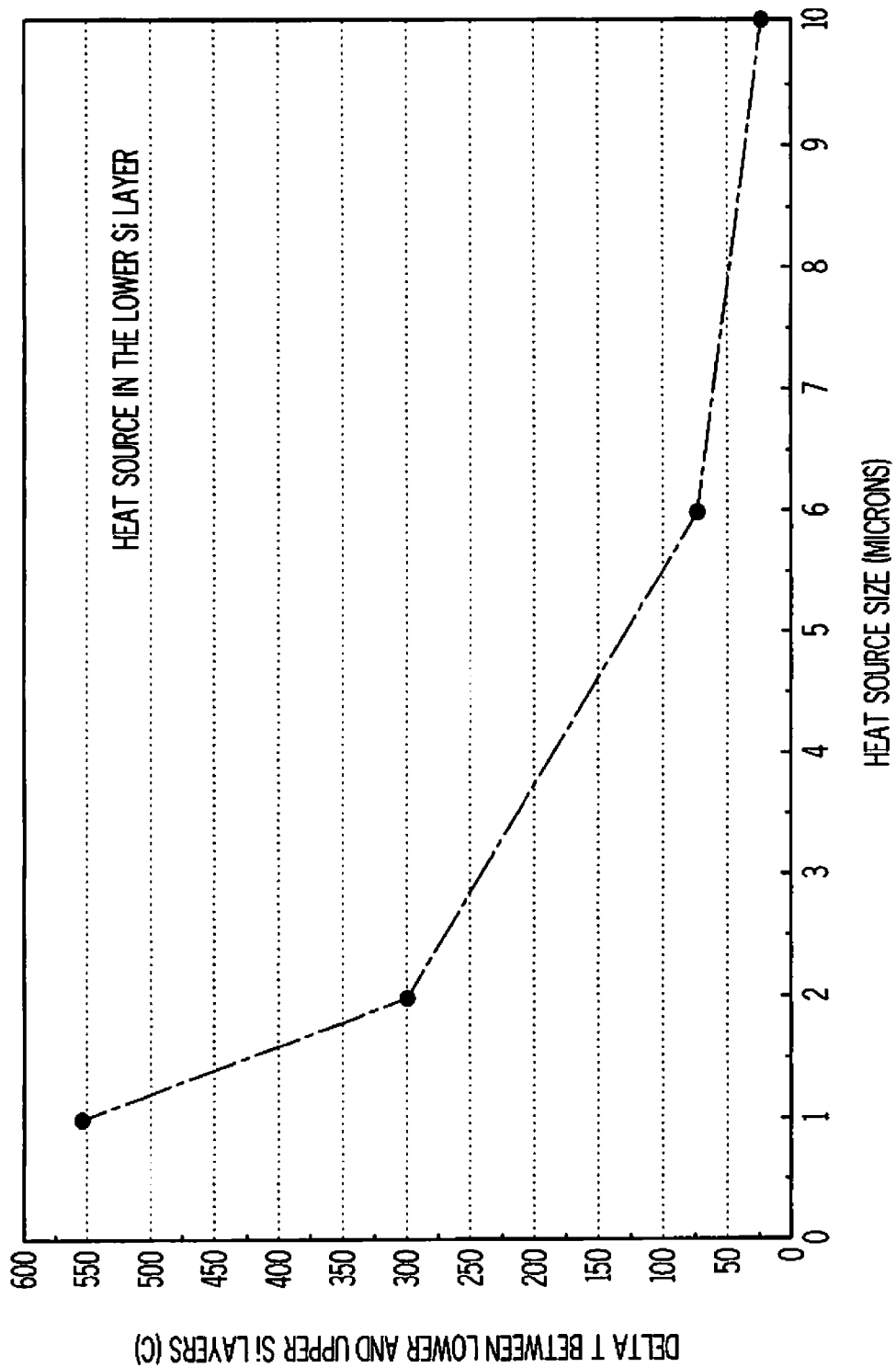
FIG. 11 is graph showing the effects that spot size of the laser has on the vertical temperature differential between the top and bottom Si layers.

Referring to FIG. 11, the effect of the spot size of the laser on the temperature gradient between the top silicon layer 12 and the bottom silicon layer 10 is illustrated. The temperature difference between the top silicon layer 12 and the bottom silicon layer 10 increases as the size of laser beam is reduced from 10×10 microns to 1×1 microns.

Figure 12:
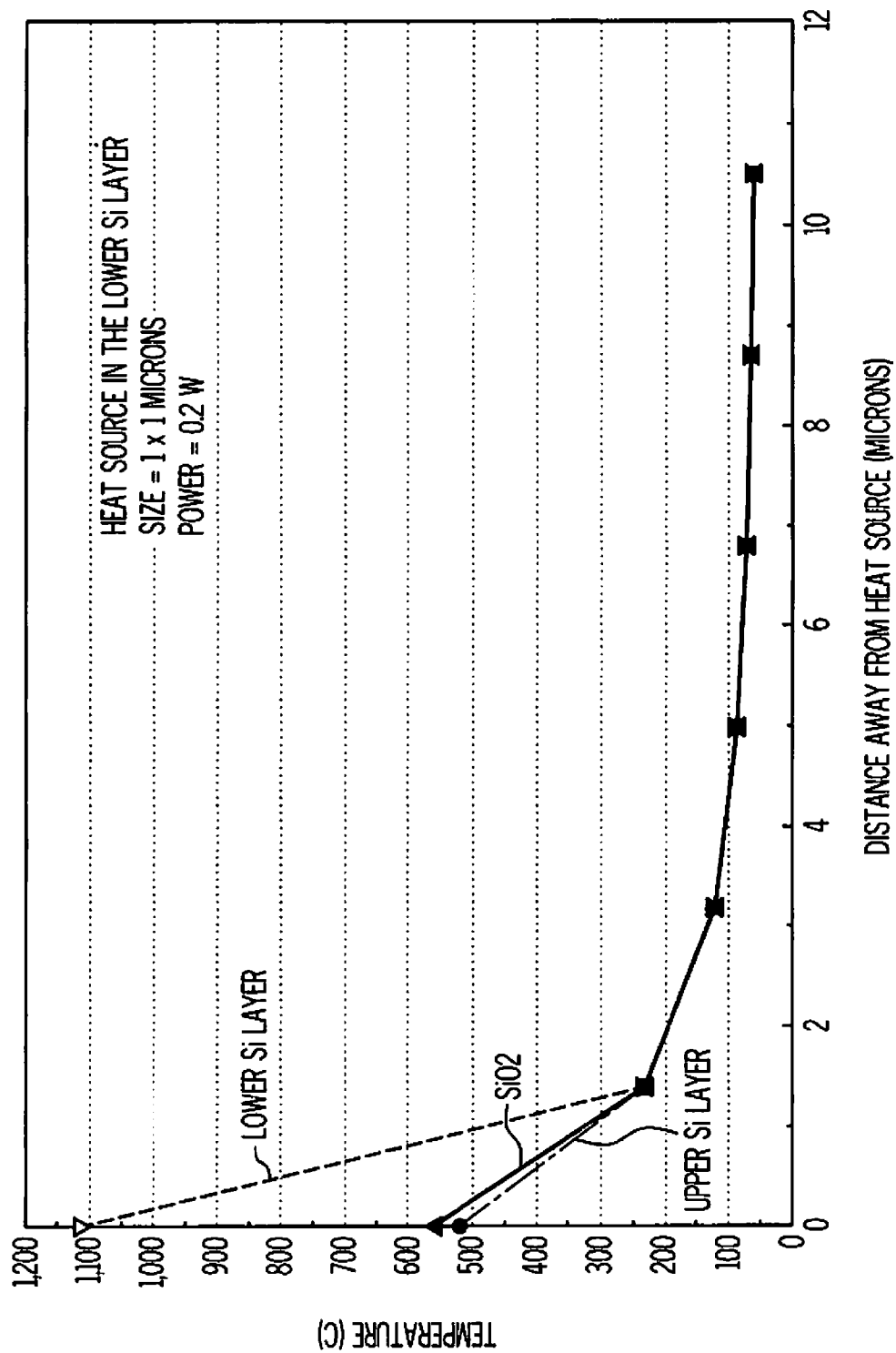
FIG. 12 is a graph showing the temperature, based upon a distance away from the heat source, in each layer of the exemplary Si/SiO$_2$/Si tri-layer structure of FIG. 5.

Referring to FIG. 12, the temperature profile, based upon distance from the spot, of each layer of the exemplary Si/$SiO_2$/Si tri-layer structure of FIG. 4 is illustrated using a heat source of a 0.03 second exposure from a 0.2 W laser using a 1×1 micron spot size focused on the lower Si layer 10. In contrast to FIG. 9, a considerable temperature difference exists between the upper silicon layer 12 and the lower silicon layer 10. Specifically, whereas the temperature at the laser spot in the lower silicon layer 10 reaches approximately 1100° C. the upper silicon layer is below 550° C. As such, by varying the spot size of the laser, the depth of laser anneal can be controlled even when the lower silicon layer 10 is being annealed.

The above-described simulation results model simplified laser spot sizes. However, these results can be generalized to model a real laser beam, e.g., in the shape of a slit, or multiple laser beams that are scanned across the surface. Moreover, the maximum temperature is not precisely directly under each beam but slightly offset to the trailing edge side as the laser is scanned across the surface. Thus, this offset should be considered when programming the movement of the laser beam across the surface to precisely control the annealing temperature and annealing depth.

Figure 13B:
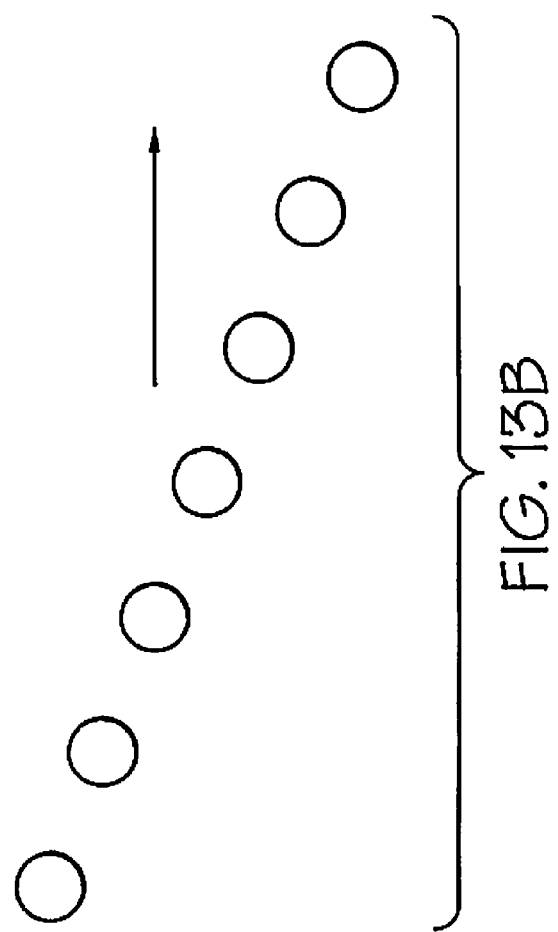
FIGS. 13A and 13B are, respectively, plan views of laser arrays, in accordance with the inventive arrangements.
Figure 13A:
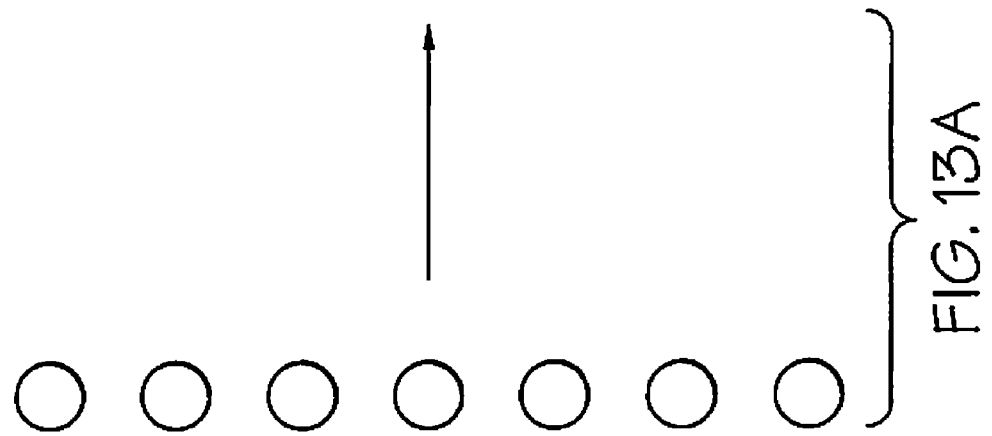

FIGS. 13A and 13B respectively illustrate alternative arrangement of laser arrays. The distance between the lasers may be selected based upon a desired thermal profile (e.g., to anneal one layer but not excessively thermally impact another layer). Referring specifically to FIG. 13A, this configuration provides good independent control, but has lower power efficiency and requires multiple adjacent scans. Referring specifically to FIG. 13B, this configuration enables the use of heat from the previous beam to preheat the region for the next beam, but requires control based on the resulting thermal responses.

Thus, the location, spot size, depth of focus, speed of scanning, and energy density of the laser can be separately programmed to meet the specific annealing requirements of the stacked semiconductor structure. Specifically, separate layers of active devices in the stacked semiconductor structure can be selectively thermally annealed without adversely affecting adjacent structures near the annealing zone. Consequently, the temperature of the devices immediately near the annealing zone, in both the horizontal and vertical directions, can be maintained in a safe range during the selective thermal annealing. Since the amount of laser energy absorbed (and converted to heat) by each feature in the surface pattern depends on the local reflectance and absorption properties of the features, the incident laser power in each scanning beam may be controlled based on the known design of the circuitry on the wafer. Also, multiple scanning beams may be used to increase the throughput of the process.

What is claimed is:

1. A method for laser annealing a stacked semiconductor structure having at least two stacked layers, comprising the steps of:
    focusing a first laser beam on a lower layer of the stacked layers;
    scanning the first laser beam to anneal features in the lower layer;
    focusing a second laser beam on an upper layer of the stacked layers; and
    scanning a second laser beam to anneal features in the upper layer.

2. The method according to claim 1, wherein the laser for the first and second laser beams has a wavelength of less than one micrometer.

3. The method according to claim 1, wherein spot size, depth of focus, and energy density of the first and second laser beams are programmable.

4. The method according to claim 1, wherein the scanning speed of the first and second laser beams is programmable.

5. The method according to claim 1, wherein features in the lower layer are offset from features in the upper layer such that these features do not overlap along a plane parallel to a path of the first and second laser beams.

6. The method according to claim 1, wherein the first and second laser beams are originated from a single laser.

7. The method according to claim 1, wherein the first and second laser beams are respectively originated from separate lasers.

8. The method according to claim 1, wherein each of the stacked layers includes an active device, a passive device, or a combination thereof.

9. The method according to claim 8, wherein at least one of the devices is a transistor.

\* \* \* \* \*